(12) United States Patent
Okoroanyanwu

(10) Patent No.: US 6,767,693 B1
(45) Date of Patent: Jul. 27, 2004

(54) MATERIALS AND METHODS FOR SUB-LITHOGRAPHIC PATTERNING OF CONTACT, VIA, AND TRENCH STRUCTURES IN INTEGRATED CIRCUIT DEVICES

(75) Inventor: Uzodinma Okoroanyanwu, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/208,370

(22) Filed: Jul. 30, 2002

(51) Int. Cl.$^7$ ................................................. G03C 5/56
(52) U.S. Cl. ........................ 430/311; 430/322; 430/330; 430/270.1; 430/273.7
(58) Field of Search ................................ 430/311, 322, 430/330, 270.1, 273.7, 273.1

(56) References Cited

U.S. PATENT DOCUMENTS

| | | | | |
|---|---|---|---|---|
| 5,487,967 | A | * 1/1996 | Hutton et al. | 430/322 |
| 5,585,215 | A | 12/1996 | Ong et al. | 430/107 |
| 6,132,928 | A | * 10/2000 | Tanabe et al. | 430/270.1 |
| 6,316,159 | B1 | 11/2001 | Chang et al. | 430/270.1 |
| 6,319,853 | B1 | 11/2001 | Ishibashi et al. | 438/780 |
| 6,436,593 | B1 | * 8/2002 | Minegishi et al. | 430/18 |
| 6,461,784 | B1 | 10/2002 | Komine et al. | 430/162 |
| 6,472,120 | B1 | 10/2002 | Jung et al. | 430/270.1 |
| 6,596,200 | B1 | 7/2003 | Ogawa et al. | 252/512 |

OTHER PUBLICATIONS

M. Siebald, R. Sezi, R. Leuscher, H. Ahne, S. Birkle, *Proc. SPIE*, 528 (1990).

M. Siebald, R. Sezi, R. Leuscher, H. Ahne, S. Birkle, *Microelectronic Engineering*, 531 (1990).

M. Siebald, J. Berthold, M. Beyer, R. Leuscher, Ch. Nolsher, U. Scheler, R. Sezi, *Proc.* SPIE, 1446, paper 21 (1991).

R. Leuscher, M. Beyer, H. Bomforder, E. Kuhn, Ch. Nolscher, M. Siebald, R. Sezi, *Proc. Soc. Plastic Engineers*, Mid–Hudson Section, Regional Technical Conference, 215, Oct. (1991).

* cited by examiner

*Primary Examiner*—Mark F. Huff
*Assistant Examiner*—Daborah Chacko-Davis
(74) *Attorney, Agent, or Firm*—Foley & Lardner LLP

(57) ABSTRACT

An integrated circuit fabrication process including exposing a photoresist layer and providing a hydrophilic layer above the photoresist layer. The photoresist layer is exposed to a pattern of electromagnetic energy. The polymers in the hydrophilic layer can diffuse into the photoresist layer after provision of the hydrophilic layer. The diffusion can lead to plasticization of the photoresist layer polymers in exposed regions relative to unexposed regions. The process can be utilized to form a large variety of integrated circuit structures including via holes, trenches, contact holes and other features with wide process latitude and smooth feature side walls.

20 Claims, 9 Drawing Sheets

MATERIALS AND METHODS FOR SUB-LITHOGRAPHIC PATTERNING OF CONTACT, VIA, AND TRENCH STRUCTURES IN INTEGRATED CIRCUIT DEVICES

CROSS REFERENCE TO RELATED APPLICATIONS

The present application is related to U.S. application Ser. No. 10/224,876 by Okoroanyanwu et al., entitled "Materials and Methods for Sub-Lithographic Patterning of Gate Structures in Integrated Circuit Devices," filed on Aug. 21, 2002 and assigned to the Assignee of the present application.

FIELD OF THE INVENTION

The present invention relates generally to integrated circuits (ICs). More particularly, the present application relates to systems for and processes of patterning of contact, via, and trench structures on a layer or substrate utilized in IC fabrication.

BACKGROUND OF THE INVENTION

The semiconductor or integrated circuit (IC) industry aims to manufacture ICs with higher and higher densities of devices on a smaller chip area to achieve greater functionality and to reduce manufacturing costs. This desire for large scale integration requires continued shrinking of circuit dimensions and device features. The ability to reduce the size of structures, such as, trenches, contact holes, vias, gate lengths, doped regions, and conductive lines, is driven by lithographic performance.

IC fabrication often utilizes a mask or reticle to form an image or pattern on one or more layers comprising a semiconductor wafer. Electromnagnetic energy such as radiation is transmitted through or reflected off the mask or reticle to form the image on the semiconductor wafer. The wafer is correspondingly positioned to receive the radiation transmitted through or reflected off the mask or reticle. The radiation can be light at a wavelength in the ultraviolet (UV), vacuum ultraviolet (VUV), deep ultraviolet (DUV), or extreme ultraviolet (EUV) range. The radiation can also be a particle beam such as an x-ray beam, an electron beam, etc.

Typically, the image on the mask or reticle is projected and patterned onto a layer of photoresist material disposed over the wafer. The areas of the photoresist material upon which radiation is incident undergo a photochemical change to become suitably soluble or insoluble in a subsequent development process. In turn, the patterned photoresist layer is used to define doping regions, deposition regions, etching regions, and/or other structures comprising the IC.

As integrated circuit device dimensions continue to shrink to increase the speed and density of devices, it becomes necessary to print contact hole and via features as well as gate and trench features with dimensions that are smaller than the resolution limit of conventional lithographic techniques. Sub-lithographic patterning of contact holes, gate conductors, trenches and vias is extremely difficult because of mask error enhancement factor (MEEF). MEEF increases as the exposure wavelength decreases. In general, lithographic resolution (w) is governed by three parameters: wavelength of light used in the exposure system ($\lambda$), numerical aperture of exposure system (NA), and a $k_1$ factor which is a measure of the level of difficulty of the process. Lithographic resolution can be defined by the following equation:

$$w = k_1 \frac{\lambda}{NA}$$

Resolution can be improved by an improvement in any of these factors or a combination of these factors (i.e., reducing the exposure wavelength, increasing the NA, and decreasing the $k_1$ factor). However, reducing the exposure wavelength and increasing the NA are expensive and complex operations.

Sub-lithographic resolution has been achieved using photoresist modification processes. Conventional photoresist modification processes typically pattern the photoresist in a conventional lithographic process and use chemical or heat procedures after development of the photoresist to reduce the size of the patterned features or to decrease the size of contact holes. One such process is a resist enhancement lithography assisted by chemical shrink (RELACS) process. The RELACS process can use polymers with an R2 coating and R200 developer to shrink the size of contact holes. Another such process is a heat reflow process, in which photoresist is partially liquified to reduce the diameter of contact holes and vias. Yet another such process reduces feature sizes by chemical etching.

Processes which manipulate the photoresist pattern after it is formed can be susceptible to unpredictable mechanical deformation as well as poor mechanical stability. For example, mechanical deformations can be caused by capillary forces, inadequate inherent mechanical stability, and/or the impact of etch and species. Accordingly, there is still a need to increase the resolution available through lithography.

Thus, there is a need to improve the resolution of lithography by decreasing the $k_1$ factor. Further, there is a need to achieve sub-lithographic patterning of contact holes, via features, trenches and gates. Further still, there is a need to reduce feature sizes without the use of RELACS chemical etch, heat flow and/or processes. Further still, there is a need for an inexpensive process for improving (reducing) the size of features or holes in features which can be lithographically patterned. Yet further, there is a need to lithographically pattern photoresist using lower doses of radiation.

BRIEF SUMMARY OF THE INVENTION

An exemplary embodiment relates to an integrated circuit fabrication process. The process includes exposing a photoresist layer to a pattern and providing an hydrophilic layer above the photoresist layer. The pattern is a matter of electromagnetic energy. The polymers in the hydrophilic layer diffuse into the exposed region of the photoresist layer upon baking the photoresist/hydrophilic overlayer film structure. The diffusion causes plasticization of photoresist layer in exposed regions relative to unexposed regions.

Another exemplary embodiment relates to a method of patterning a photoresist layer for an integrated circuit. The method includes steps of providing a pattern of electromagnetic energy to a photoresist layer, baking the photoresist layer, coating a hydrophilic layer above the photoresist layer, baking the photoresist/hydrophilic overlayer film structure, and developing the photoresist layer. The polymers in the hydrophilic overlayer diffuse into the exposed region of the photoresist layer upon baking. The diffusion causes the plasticization of the photoresist layer in the exposed regions relative to the unexposed regions. The photoresist layer is developed to form a photoresist pattern similar to the pattern of electromagnetic energy. Resolution is increased due to at least in part to the overlayer.

Still another exemplary embodiment relates to the lithographic medium. The lithographic medium includes a patterned photoresist material including first regions of exposure to electromagnetic energy and second regions of non-exposure to the electromagnetic energy. The medium also includes a layer of hydrophilic material.

BRIEF DESCRIPTION OF THE DRAWINGS

The exemplary embodiments will become more fully understood from the following detailed description, taken in conjunction with the accompanying drawings, wherein like reference numerals denote like elements, in which.

DETAILED DESCRIPTION OF THE EXEMPLARY EMBODIMENTS

Figure 1:
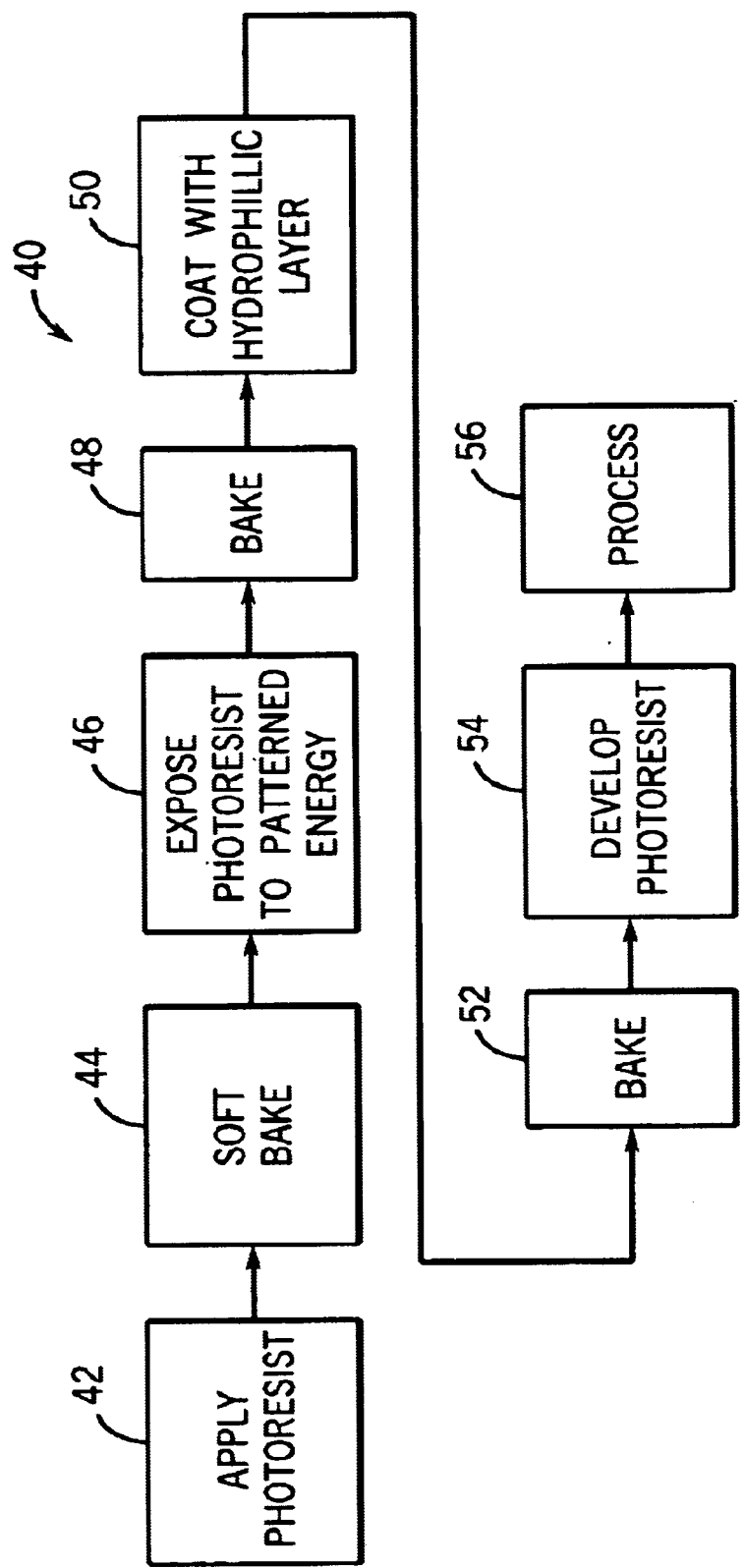
FIG. 1 is a flow diagram showing a photoresist patterning process for an integrated circuit wafer including a photoresist layer in accordance with an exemplary embodiment.

In one embodiment of the present invention, an advantageous process for forming features patterned on a photoresist layer is provided. The features allow holes, trenches, or other structures to be formed at dimensions smaller than conventionally possible. As used in the present application, the term feature can refer to a hole in a photoresist material, an island of photoresist material, or other lithographically formed structure associated with photoresist materials.

Preferably, the process can be implemented in an inexpensive fashion using available tools and materials. The process can be used to form extremely small (e.g., sublithographic) contact holes, vias, and trench structures with wide process latitude and smooth feature side walls. Further, the process can prevent exposure lens contamination due to top coat materials. Further still, the process can advantageously allow for the use of low exposure dose imaging, which in turn enhances exposure tool throughput relative to conventional processes.

The advantageous process comprises exposing (e.g., treating) a photoresist layer to a pattern of electromagnetic energy. A hydrophilic layer is provided above the photoresist layer that has been exposed to the pattern of electromagnetic energy. According to one embodiment, the hydrophilic layer diffuses into the photoresist layer upon baking, leading to plasticization of polymers in the exposed portion of the photoresist layer. Plasticization of the exposed regions of the photoresist enhances the diffusion of the photogenerated acids, leading to enhanced deprotection of the protecting groups of the photoresist. This phenomenon allows a lower dose of electromagnetic energy to be used to pattern the photoresist layer, thereby increasing resolution of the features. The lower dose can be utilized because diffusion from the hydrophilic layer ensures that the photoresist completely reacts to the pattern of electromagnetic energy.

Since the advantageous process may be implemented one or more times and at various points within an integrated circuit (IC) fabrication process, several embodiments will be described. However, the process of the present invention is not limited to the formation of any particular structure, hole, or region, and can be used in any process where photoresist is patterned.

A process flow 40 (FIG. 1) for lithographically patterning a structure in or on an IC wafer includes a photoresist application step 42, a soft bake step 44, an exposure step 46, a bake step 48, a hydrophilic layer coating step 50, a bake step 52, a photoresist developing step 54, and a processing step 56. In general, process 40 or portions of the process can be performed in a lithographic system 10. An exemplary lithographic system 10 is shown in FIG. 2.

Lithographic system 10 includes a chamber 12, a light source 14, a condenser lens assembly 16, a mask or a reticle 18, an objective lens assembly 20, and a stage 22. Lithographic system 10 is configured to transfer a pattern or image provided on mask or reticle 18 to a wafer 24 positioned in lithography system 10. Wafer 24 includes a layer of photoresist material.

Lithographic system 10 may be a lithographic camera or stepper unit. For example, lithographic system 10 may be a PAS 5500/900 series machine manufactured by ASML, a microscan DUV system manufactured by Silicon Valley Group, or an XLS family microlithography system manufactured by Integrated Solutions, Inc. of Korea. Preferably, chamber 12 and system 10 comprise a UV chamber designed for patterning with 248 nm, 193 nm, 157 nm, and 13.4 nm wavelength light.

Chamber 12 of lithographic system 10 can be a vacuum or low pressure chamber for use in ultraviolet (UV), vacuum ultraviolet (VUV), deep ultraviolet (DUV), extreme ultraviolet (EUV), x-ray, or other types of lithography. Chamber 12 can contain any of numerous types of atmospheres, such as, nitrogen, etc. Alternatively, chamber 12 can be configured to provide a variety of other patterning schemes.

Figure 2:
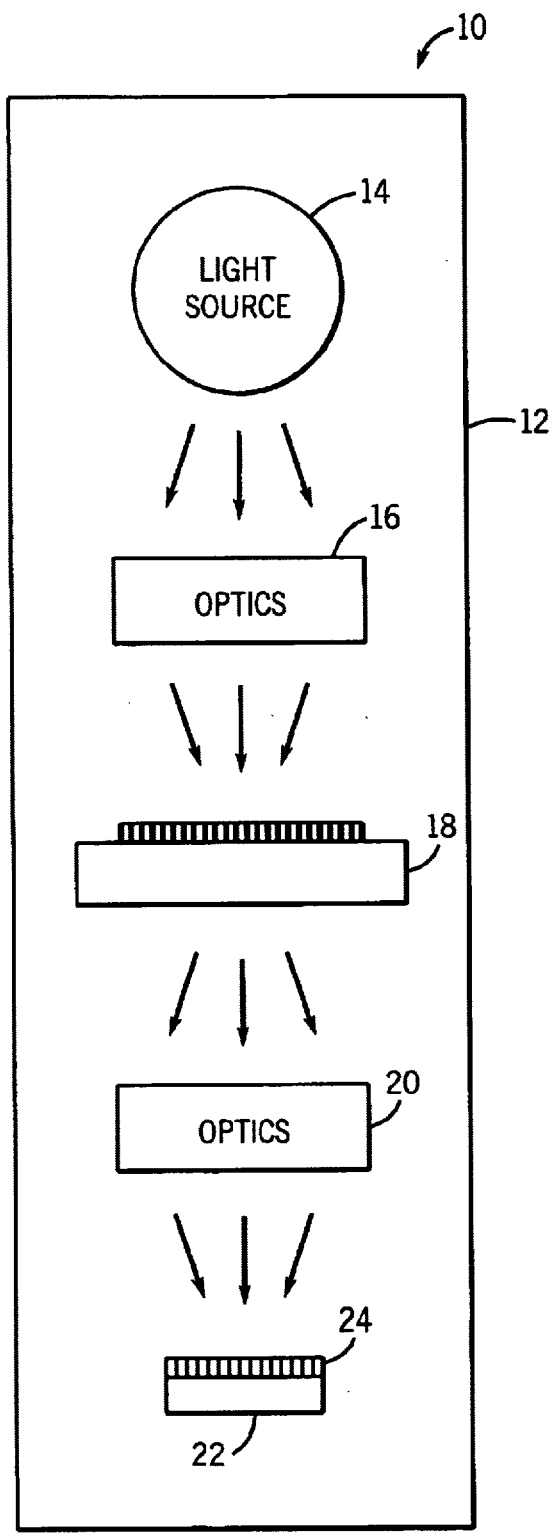
FIG. 2 is a block diagram of a system for patterning the photoresist layer in accordance with the process illustrated in FIG. 1.

Light source 14 provides electromagnetic energy (e.g., light, radiation, particle beams, etc.) through condenser lens assembly 16, mask or reticle 18, and objective lens assembly 20 to photoresist layer 30 in step 46 (FIG. 1). Light source 14 provides electromagnetic energy at a wavelength of 193 nm, although other wave lengths and light sources can be utilized. A light source having a wavelength of 365 nm, 248 nm, 157 nm, or 126 nm, or a soft x-ray source having a wavelength of 13.4 nm can also be utilized. Alternatively, light source 14 may be a variety of other energy sources capable of emitting electromagnetic energy, such as radiation having a wavelength in the ultraviolet (UV), vacuum ultraviolet (VUV), deep ultraviolet (DUV), extreme ultraviolet (EUV), x-ray or other wavelength range or electromagnetic energy, such as e-beam energy, particle beam energy, etc.

Assemblies 16 and 20 include lenses, mirrors, collimators, beam splitters, and/or other optical components to suitably focus and direct a pattern of radiation (i.e., radiation from light source 14 as modified by a pattern or image provided on mask or reticle 18) onto photoresist layer 30. Stage 22 supports wafer 24 and can move wafer 24 relative to assembly 20.

System 10 is not described in a limiting fashion. Process 40 can be implemented utilizing any type of conventional lithographic equipment or modifications thereof. Further, future advances in lithographic equipment, such as those related to EUV and VUV technologies can be utilized to carry out process 40. Process 40 can utilize any equipment capable of patterning layer 30 with electromagnetic energy without departing from the scope of the invention.

Figure 3:
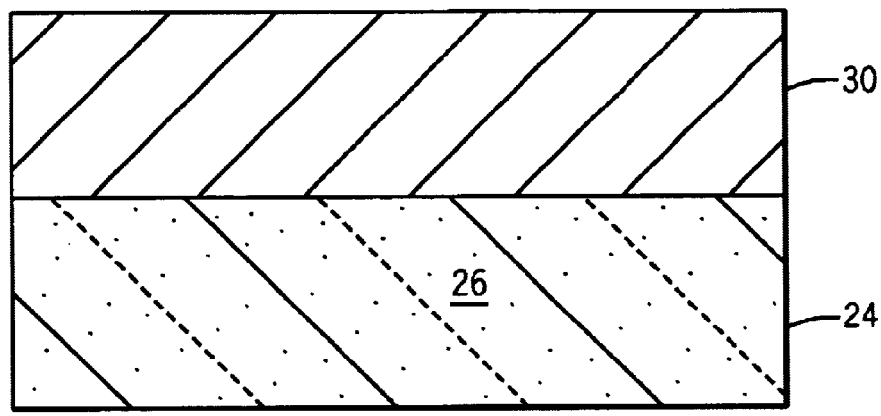
FIG. 3 is a cross-sectional view of a wafer for use in the process illustrated in FIG. 1, showing an application step for the photoresist layer.

With reference to FIG. 3, wafer 24 includes a substrate 26 and a photoresist layer 30. Wafer 24 can be an entire integrated circuit (IC) wafer or a part of an IC wafer. Wafer 24 can be a part of an IC, such as, a memory, a processing unit, an input/output device, etc. Substrate 26 can be a semiconductor substrate, such as, silicon, gallium arsenide, germanium, or other substrate material. Substrate 26 can include one or more layers of material and/or features, such as lines, interconnects, vias, doped regions, etc., and can further include devices, such as, transistors, microactuators, microsensors, capacitors, resistors, diodes, etc.

Although photoresist layer 30 is shown disposed directly over substrate 26, intermediate layers can be provided between layer 30 and substrate 26. For example, layer 30 can be applied over an insulative layer, a conductive layer, a barrier layer, an anti-reflective coating (ARC), a mask layer or other layer of material to be etched, doped, or layered. In one embodiment, one or more layers of materials, such as, a polysilicon stack comprised of a plurality of alternating layers of titanium silicide, tungsten silicide, cobalt silicide materials, etc., can be between substrate 26 and layer 30.

In another embodiment, a hard mask layer, such as a silicon nitride layer or a metal layer, can be provided between substrate 26 and layer 30. The hard mask layer can serve as a patterned layer for processing substrate 26 or for processing a layer upon substrate 26. In yet another embodiment, an anti-reflective coating (ARC) can be provided between substrate 26 and layer. 30.

Further, layer 30 can be provided over dielectric and conductive layers associated with interconnect or metal layers (e.g., metal 1, 2, 3, etc., ILP0, ILP1, ILP2, etc.). Substrate 26 and layers above it are not described in a limiting fashion, and can each comprise any conductive, semiconductive, or insulative material.

Photoresist layer 30 can comprise a variety of photoresist chemicals suitable for lithographic applications. Photoresist layer 30 is selected to have photochemical reactions in response to electromagnetic energy emitted from light source 14. Materials comprising photoresist layer 30 can include, among others, a matrix material or resin, a sensitizer or inhibitor, and a solvent. Photoresist layer 30 is preferably a chemically or non-chemically amplified, positive tone photoresist. Photoresist layer 30 preferably includes a hydrophobic polymer and appropriate photoacid generator (PAG).

Photoresist layer 30 may be, but is not limited to, an acrylate-based polymer, an alicyclic-based polymer, a phenolic-based polymer, or a cyclo-olefin-based polymer. For example, photoresist layer 30 may comprise PAR-721 photoresist manufactured by Sumitomo Chemical Company.

Photoresist layer 30 is deposited, for example, by spin-coating over layer 28 in step 42 in FIG. 1. Photoresist layer 30 can be provided at a thickness of less than 1.0 $\mu$m. Layer 30 preferably has a nominal thickness (e.g., preferably 400 nm thick).

After application to substrate 26 or a layer above it, layer 30 is baked in step 44 (FIG. 1). Layer 30 can be soft baked to remove or dry out non-aqueous solvent associated with layer 30 (e.g., a pre-bake step). Preferably, layer 30 can be soft baked at a temperature of a few degrees lower than the glass transition temperature (Tg) of the photoresist polymer resin.

Mask or reticle 18 is a phase shift mask in one embodiment. For example, mask or reticle 18 may be an attenuating phase shift mask, or other type of mask such as a binary mask or reticle. In a preferred embodiment, mask or reticle 18 is a dark field mask when system 10 is employed to fabricate contact holes or trenches.

In another embodiment, mask or reticle 18 is a binary mask including a translucent substrate (e.g., glass or quartz) and an opaque or absorbing layer (e.g., chromium or chromium oxide). The absorbing layer provides a pattern or image associated with a desired circuit pattern, features, or devices to be projected onto photoresist layer 30.

Figure 4:
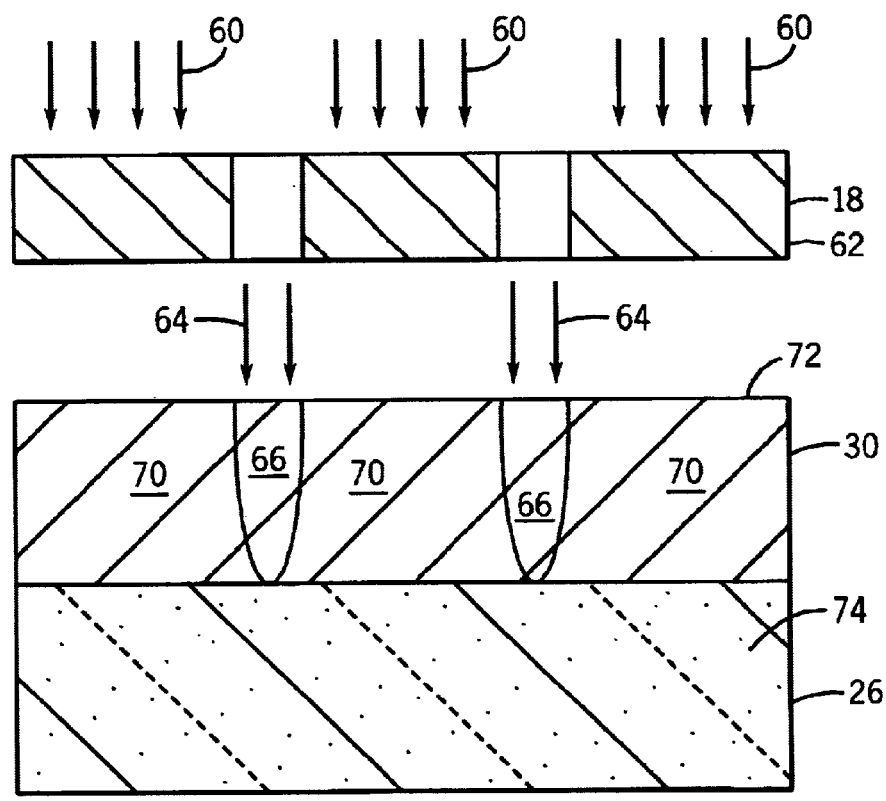
FIG. 4 is a cross-sectional view of a wafer for use in the process illustrated in FIG. 1, showing an electromagnetic energy patterning step for the photoresist layer.

With reference to FIG. 4, electromagnetic energy 60 from source 14 (FIG. 2) is effectively blocked by portions 62 of reticle 18. Preferably, reticle 18 is a dark field mask in this embodiment. However, electromagnetic energy 64 strikes layer 30 according to a pattern (e.g., portions 62) associated with reticle 18. The exposure to electromagnetic energy 64 provides a pattern in layer 30 of exposed regions 66 and unexposed regions 70. Alternatively, other techniques of and systems for providing patterned electromagnetic energy can be utilized.

As shown in FIG. 4, exposed regions 66 are generally wider at a top end 72 than a bottom end 74 due to attenuation of the electromagnetic energy by absorption in the photoresist. Regions 66 have an increased concentration of photoacid due to the photoacid generated by being exposed to electromagnetic energy 64.

After exposure to electromagnetic energy 64, layer 30 is baked in step 48. Preferably, a post-exposure bake at an appropriate temperature is utilized in step 48. Photoresist layer 30 is baked to enhance diffusion of the photoacid in region 66. In addition, the baking step causes thermolysis of the acid-labile protecting groups of the polymers in layer 30.

Figure 5:
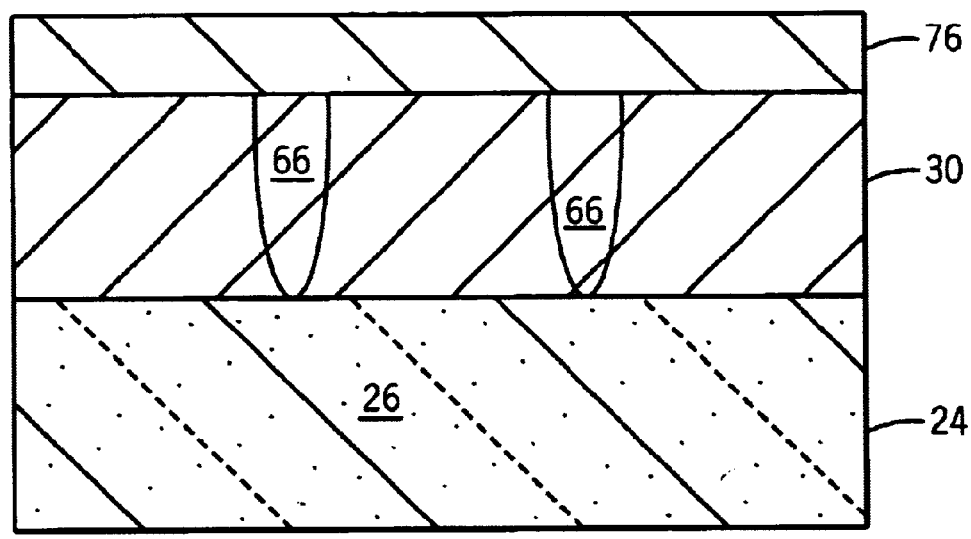
FIG. 5 is a cross-sectional view of a wafer for use in the process illustrated in FIG. 1, showing an overlayer deposition step for the photoresist layer.

With reference to FIG. 5, layer 30 is coated with a hydrophilic layer 76. In addition, layer 30 can be provided with a surfactant from an appropriate solvent on top of layer 30. Layer 30 preferably has a thickness of 300–1000 nm and is deposited by spin-coating.

The provision of surfactants preferably improves the weting, leveling and flow characteristics of layer 76 disposed over layer 30. Suitable surfactants include, but are not limited to, fluorosurfactants like 3M™ fluorad™ and 3M™ fluorosurfactant FC-4430™. Alternative surfactants can be utilized.

Preferably, hydrophilic layer 76 is a polymeric hydrophilic overlayer (HOL) and has a lower glass transition temperature (Tg) than the polymer in photoresist layer 30. In one embodiment, layer 76 is able to diffuse into the polymer of the exposed portion of the photoresist layer 30 upon baking and is preferably phase compatible with the polymer in photoresist layer 30. Suitable materials for layer 76 include, but are not limited to polymers and co-polymers of: fluoroalkyl methacrylic acid, fluoroalkyl acrylic acid, alpha and/or beta.-monoethylenically unsaturated monomers containing acid functionality, such as monomers containing at least one carboxylic acid group including acrylic acid, methacrylic acid, (meth)acryloxpropionic acid, itaconic acid, maleic acid, maleic anhydride acid, crotonic acid, monoalkyl maleates, monoakyl fumerates and monoalkyl itaconates; acid substituted (meth)acrylates, sulfoethyl methacrylate and phosphoethyl (meth)acrylate; acid substituted (meth)acrylamides, such as 2-acrylamido-2-methylpropylsulfonic acid and ammonium salts of such acid functional and acid-substituted monomers; basic substituted (meth)acrylates and (meth)acrylamides, such as amine substituted methacrylates including dimethylaminoethyl methacrylate, tertiary-butylaminoethyl methacrylate and dimethylaminopropyl methacrylamide; acrylonitrile; (meth)acrylamide and substituted (meth)acrylarnide, such as diacetone acrylamide; (meth)acrolein; and methyl acrylate.

The above list for materials in layer 76 is not exhaustive. Layer 76 can include compositions or combinations of layers and materials. For example, layer 76 can be a multilayer or a composite layer comprised of combinations of materials listed above.

Figure 6:
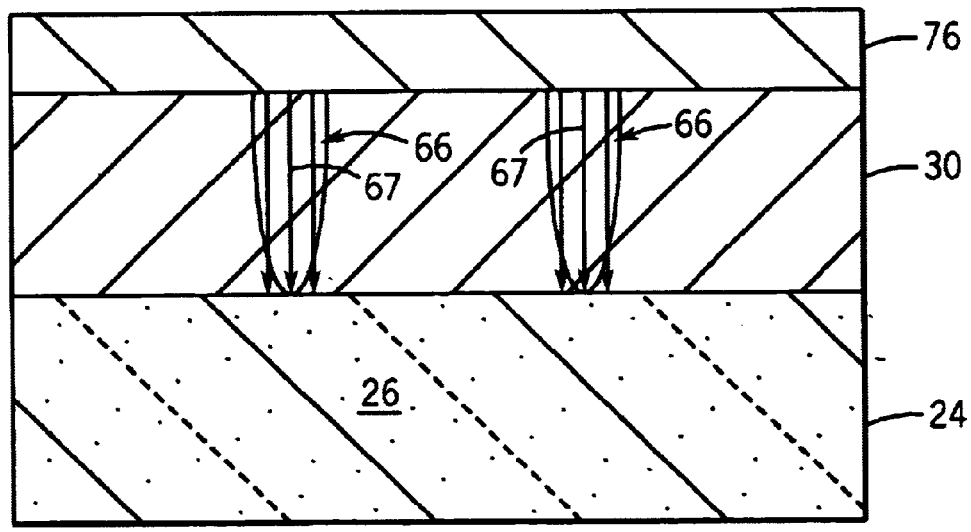
FIG. 6 is a cross-sectional view of a wafer for use in the process illustrated in FIG. 1, showing a baking step for the photoresist layer.

With reference to FIG. 6, wafer 24 is subject to baking in step 52. Preferably, layer 76 and layer 30 are baked at any temperature above the glass transition temperature (Tg) of layer 76 but below the glass transition temperature (Tg) of the polymer associated with layer 30.

Baking preferably enhances the diffusion of melted/glassy hydrophilic polymers and the surfactant into the polymer of photoresist layer 30, leading to plasticization of the polymer in exposed regions 66 of layer 30 relative to unexposed regions of layer 30.

Plasticization decreases the glass transition temperature (Tg) and enhances diffusion of the photoacid (as represented by arrows 67 in FIG. 6) within the exposed region 66 of layer 30 relative to unexposed portions. Increased diffusion of the photoacid increases the de-protection of the hydrophobic protecting groups like t-butyl ester group of the plasticized polymer of layer 30, thereby leading to increased formation of hydrophilic moieties like carboxylic acid moieties within the polymer of photoresist layer 30 relative to an exposed area of the same layer 30 without the use of layer 76. Accordingly, due to the increased diffusion of photoacid due to layer 76, a significantly lower exposure energy can be used to accurately and completely pattern layer 30.

The degree of diffusion of the hydrophilic polymer from layer 76 into the hydrophobic polymer of layer 30 is temperature dependent. The greater the temperature, the greater the degree of plasticization and diffusion. Also, the diffusion is a self-limiting process as it terminates when melted hydrophilic polymer concentration from layer 76 is exhausted. Therefore, the thicker hydrophilic polymer (the thicker layer 76) results in greater diffusion into the polymer of photoresist layer 30 and consequently greater plasticization of the polymer of layer 30 and greater enhancement of diffusion of the photoacid within the polymer of layer 30.

As discussed above, greater enhancement of the diffusion of the photoacid within layer 30 results in greater enhancement of the de-protection reaction. Therefore, the baking temperature of step 52 and exposure dose of step 46 can be used to control the critical dimensions of the structure to be patterned. Therefore, baking temperatures, the thickness of layers 76 and 30, and energy dosages can be adjusted in, accordance with the system parameters and design criteria.

Figure 7:
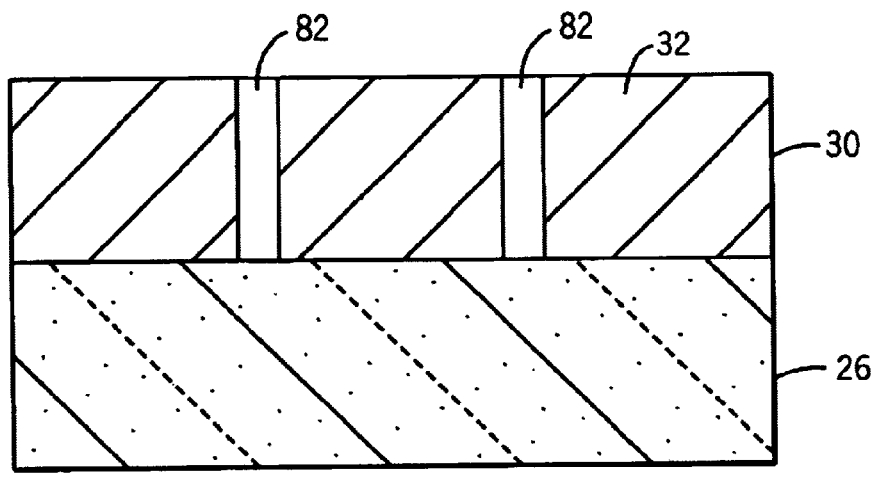
FIG. 7 is a cross-sectional view of a wafer for use in the process illustrated in FIG. 1, showing a development step for the photoresist layer.

With reference to FIG. 7, layer 30 is developed to provide features 32 defining holes or apertures 82 in step 54. Apertures 82 can be utilized in a variety of integrated circuit processing including trench formation, contact formation, via formation, as well as doping windows, or other integrated circuit fabrication processes.

In a preferred embodiment, layer 76 is removed in the developing process (step 54). Alternatively, layer 76 can be stripped before step 54 and after step 52. Layer 76 can be stripped by simply rinsing in de-ionized water.

Layer 30 is preferably developed in an aqueous basic solution such as 0.24N tetramethylammonium hydroxide. The aqueous basic solvent dissolves and washes away exposed regions 66 of the resist which include carboxylic acid moieties. Due to the preferential diffusion of layer 76 into exposed region 66 (FIG. 6) of layer 30 (enhanced de-protection of the photoresist polymer in regions 66), dissolution contrast is enhanced in exposed region 66 (FIG. 6) at significantly lower exposure doses. This provides improved critical dimension reduction, improved processing windows and exposure latitudes as well as smoother side walls, and line edge profiles of features 32 of layer 30 relative to features processed according to conventional fashions.

Figure 8:
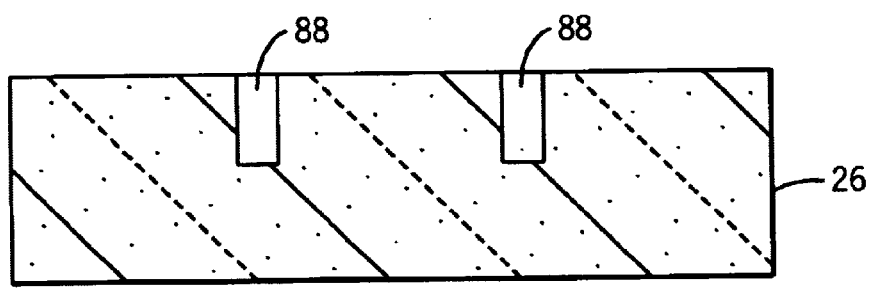
FIG. 8 is a cross-sectional view of a wafer for use in the process illustrated in FIG. 1, showing a trench formation step.
Figure 9:
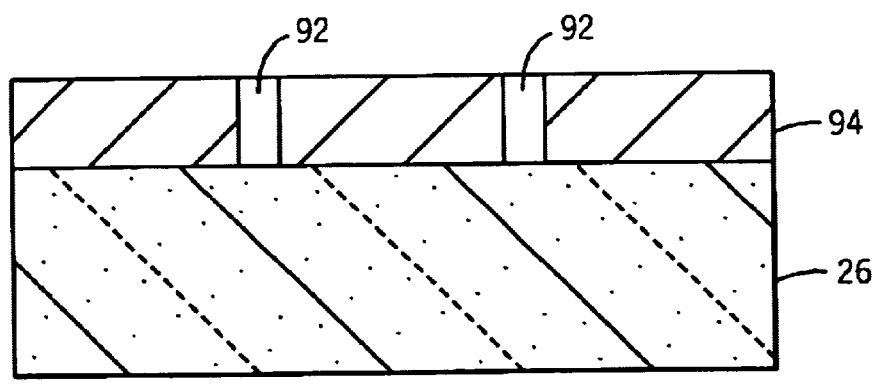
FIG. 9 is a cross-sectional view of a wafer illustrated in FIG. 1, showing a via hole formation step above a substrate.

With reference to FIG. 8, substrate 26 is further processed in accordance with features 32 (FIG. 7) to form trenches 88 in substrate 26 according to step 56 (FIG. 1). Trenches 88 can be formed by etching in a conventional process. Alternatively, in FIG. 9, a dielectric layer above substrate 26 can be processed to include vias 92 such as vias for contacts through a dielectric layer 94. Vias 92 can be formed using the process described above with reference to FIGS. 1–7.

Figure 10:
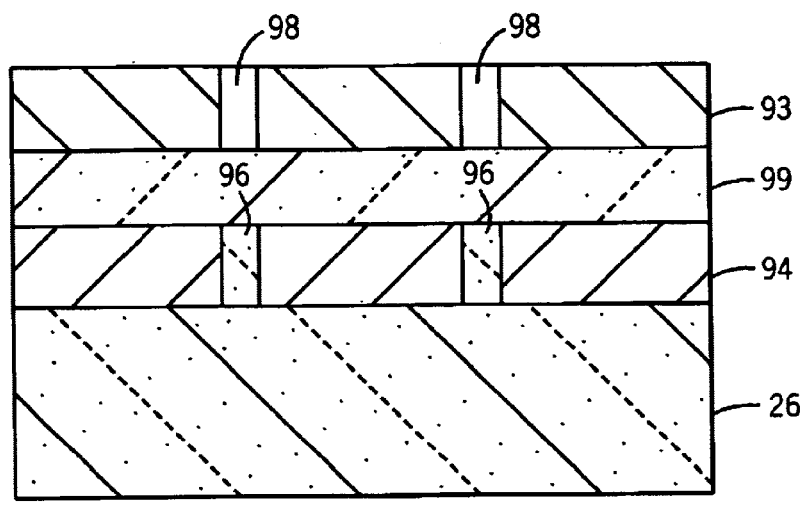
FIG. 10 is a cross-sectional view of a wafer illustrated in FIG. 1, showing a via hole formation step above a metal layer.

In yet another alternative in FIG. 10, contacts 96 can be formed above substrate 26 using the process described with reference to FIGS. 1–7 and via holes or apertures 98 can be formed in a photoresist layer above a conductive layer 99 above dielectric layer 94 using the process described with reference to FIGS. 1–7. Conductive vias can be provided in apertures 98 to form contacts to layer 99.

With reference to FIG. 11 A–C, a representations of scanning electron microscope (SEM) micrographs of vias in layer 30 fabricated by different processes can be compared.

Figures 11A, 11B, 11C:
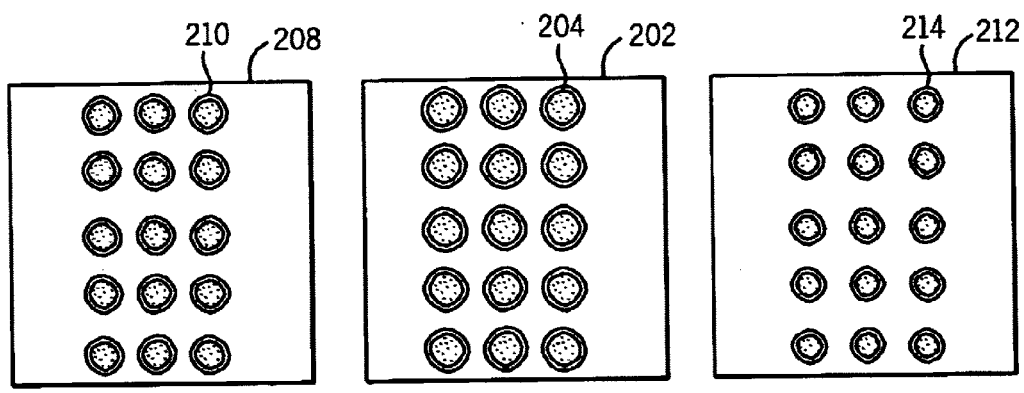
FIGS. 11A–C are representations of three micrographs showing contact holes, the contact holes are formed according to an exemplary embodiment of the present invention, according to a conventional double baked process and according to a conventional single bake process, respectively.

With reference to FIG. 11B, a representation of SEM micrograph 202 includes via structures 204 formed by the process described with reference to FIGS. 1–6. With reference to FIG. 11A, a representation of an SEM micrograph 208 includes via structures 210. Via structures 210 are formed in accordance with a conventional double-baked process at 130° C. With reference to FIG. 11C, a representation of a micrograph 212 includes via structures 214 formed in accordance with a conventional lithographic process.

Via structures 204, 210 and 214 in FIGS. 11 A–C were formed at best focus with a 12 mJ exposure dose, and a post-exposure bake temperature of approximately 130° C. As can be seen in FIGS. 11 A–C, via structures 204, formed in accordance with the process described with reference to FIGS. 1–7 are rounder, smoother and larger than those obtained with conventional single-bake and double-bake processes (vias 210 and 214). The rounder, smoother nature of vias 204 indicates a greater potential for forming smaller features than conventional processes.

Figure 12:
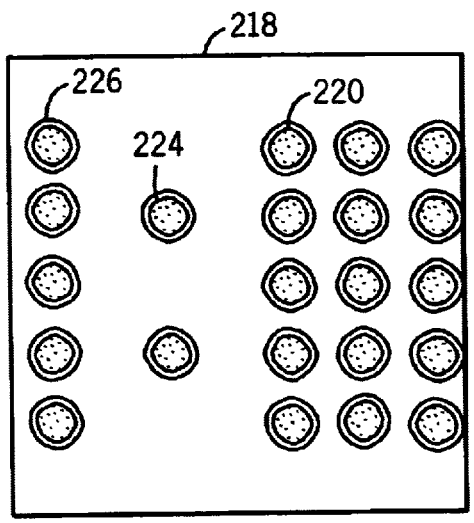
FIG. 12 is a representation of a micrograph including via structures formed in accordance with an exemplary embodiment of the present invention before etch patterning.
Figure 13:
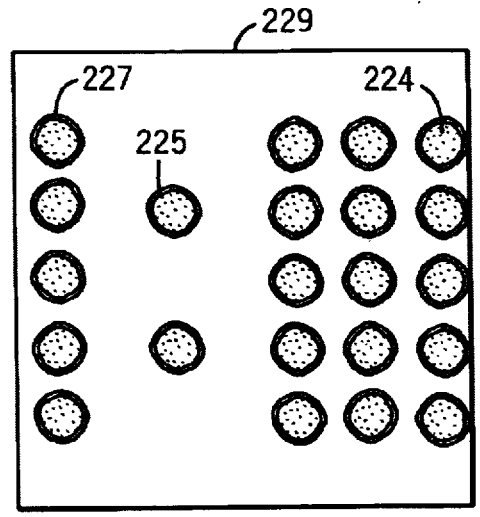
FIG. 13 is a representation of a micrograph showing via structures formed in accordance with an exemplary embodiment of the present invention after etch patterning.

With reference to FIG. 12, a representation of a micrograph 218 includes dense via structures 220, isolated via structures 224, and string via structures 226 formed according to the process described above with reference to FIGS. 1–6. With reference to FIG. 13, a representation of a micrograph 229 shows dense via structures 224, isolated structures 225 and string via structures 227. Vias structures 221, 225 and 227 have a dimension of approximately 120 nm following photoresist processings and are formed using via structures 220, 224 and 226, respectively. The dimensions of via structures 220, 224, and 226 are approximately 90 nm.

Figure 14:
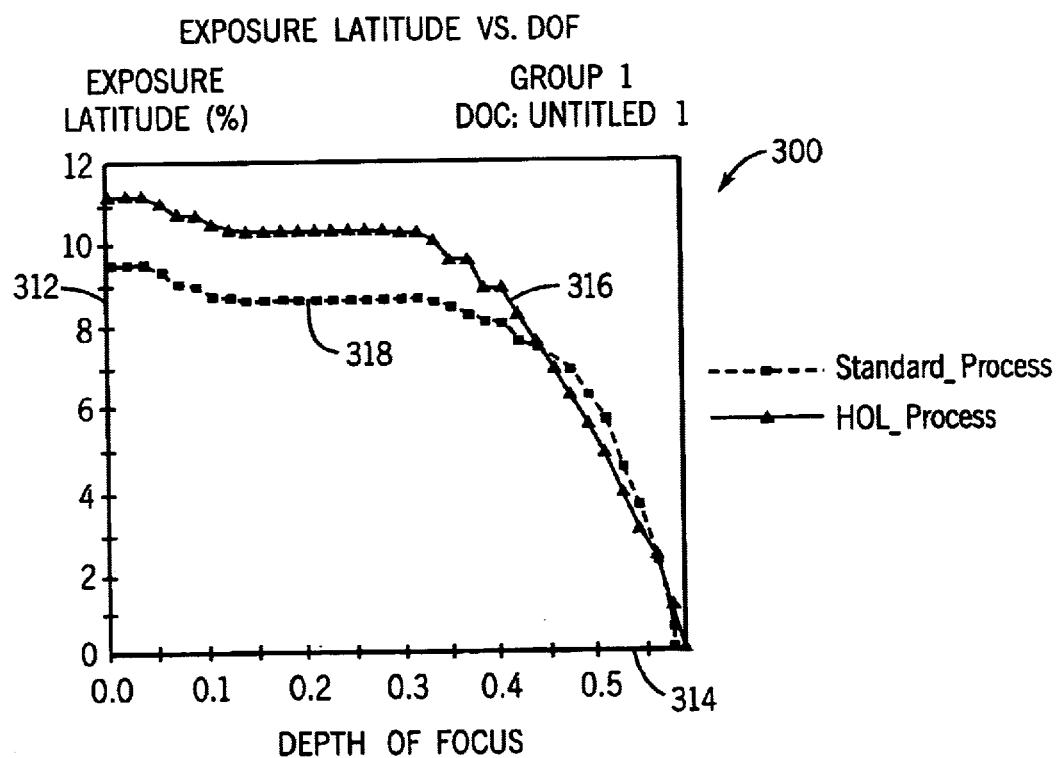
FIG. 14 is a graph showing process windows for patterning 130 nm vias using both the process illustrated in FIG. 1 and a standard process.
Figure 15:
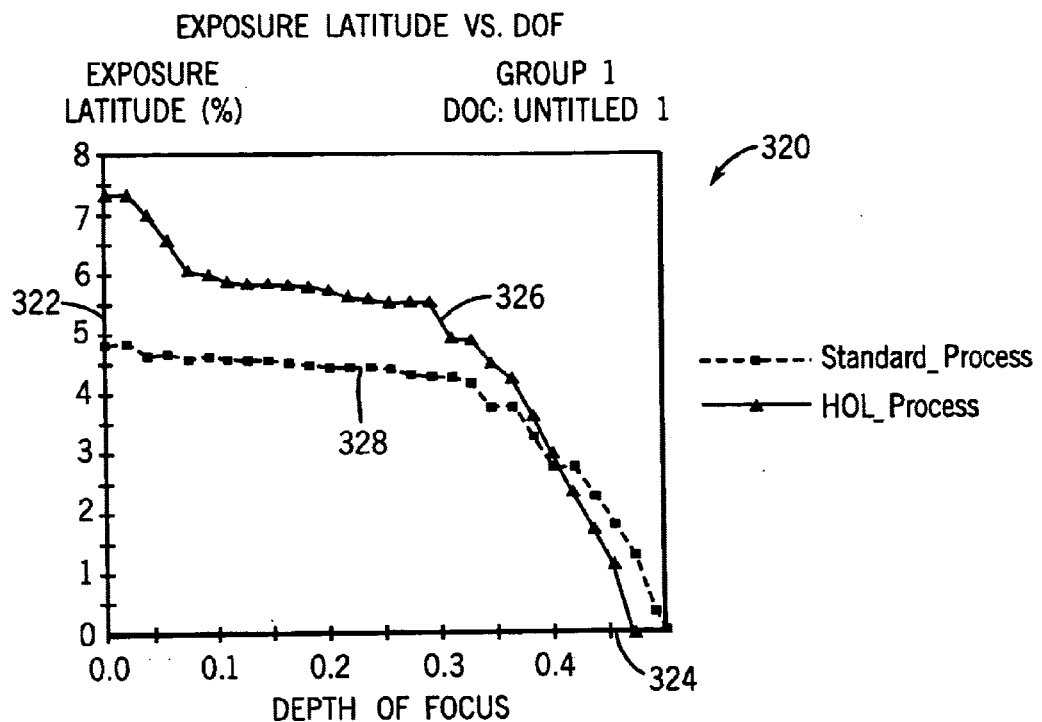
FIG. 15 is a graph showing process windows for patterning 100 nm vias using both the process illustrated in FIG. 1 and a standard process.

With reference to FIGS. 14 and 15, graphs 300 and 320 show the process windows of 130 nm and 100 nm vias patterned using the HOL process and a standard process, using KrF (248 nm laser) lithography. The resist used was DXP 6270P from Clariant Corporation. The bake temperature for both the HOL and the standard process was 130° C. The Y-axes 312, 322 represent exposure latitude in percent, and the X-axes 314, 324 represent depth of focus in micrometers of the via structures. The process window is the area under each line 316, 318, 326, 328. The process window obtained with the HOL process (e.g., the process window under lines 316 and 326) is much larger than that obtained with the standard process (e.g., the process window under lines 318 and 328) for both the 130 nm and 100 nm run vias.

Figure 16:
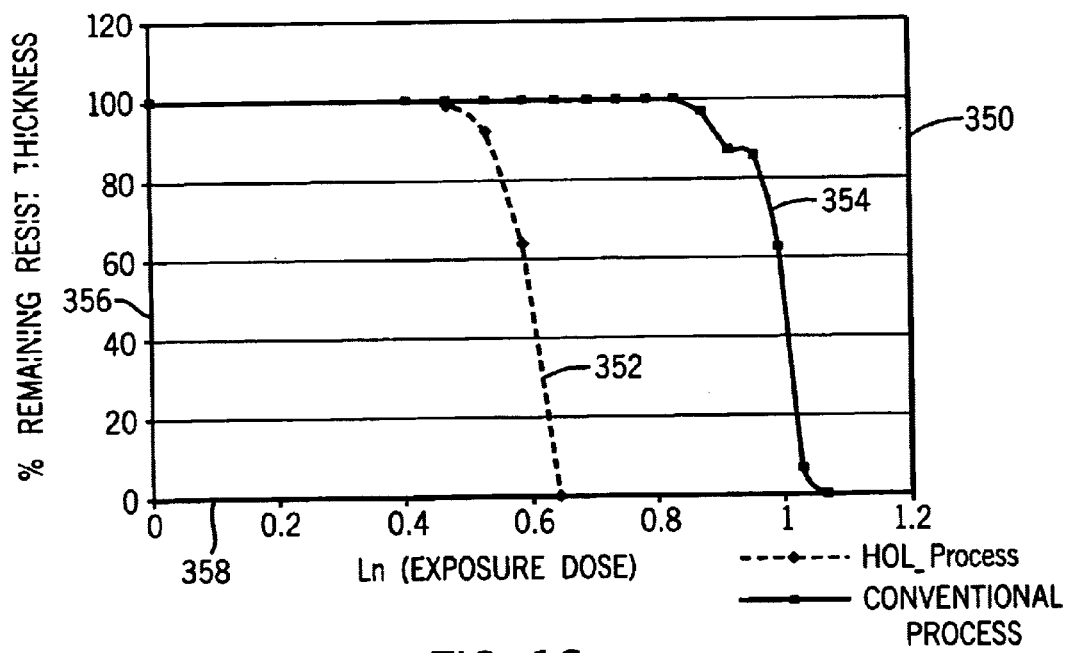
FIG. 16 is a comparison of lithographic contrast curves for a conventional lithographic process and a process according to an exemplary embodiment.

With reference to FIG. 16, contrast curves for PAR-721 resists patterned in accordance with the process described above with reference to FIGS. 1–6 and for PAR-721 resist patterned by conventional process are shown. Graph 350 (the logarithmic sensitivity plot) shows thickness versus exposure energy. The contrast is defined as the linear slope of the transition region and describes the ability of the resist to distinguish between exposed and non-exposed areas.

A line 352 represents a process described with reference to FIGS. 1–6 and a line 354 represents a conventional process. A Y-axis 356 represents a percentage of resist thickness and an X-axis 358 is the logarithm of the exposure dose in mJ. As shown by lines 352 and 354, a smaller exposure dose is able to expose and de-protect the entire thickness of photoresist when using the process described with reference to FIGS. 1–6.

Graph 350 shows that the contrast curve of the process described with reference to FIGS. 1–6 is superior to a conventional process. Curve 352 shows the remaining resist of a uniformly-illuminated photoresist versus the logarithm of the applied exposure dose.

Figure 17A:
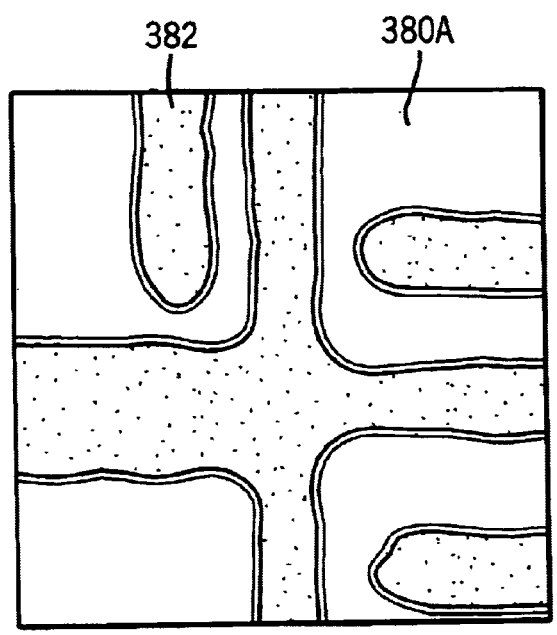
FIG. 17A shows a representation of a micrograph illustrating trench structures obtained with a conventional process.
Figure 17B:
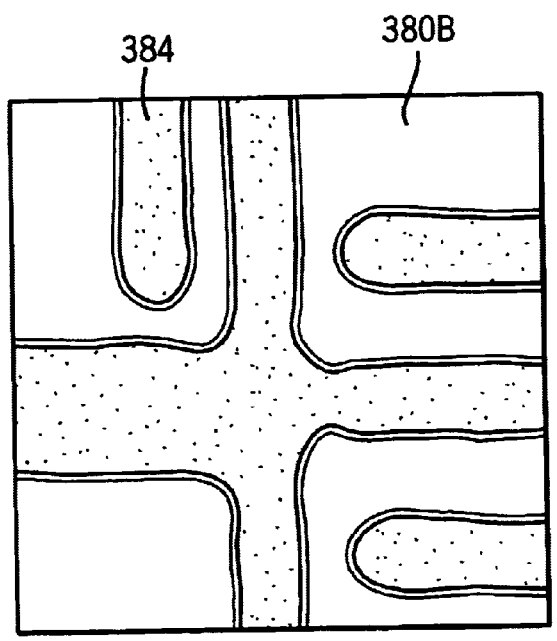
FIG. 17B shows a representation of a micrograph illustrating trench structures obtained with a hydrophilic overlayer process according to an exemplary embodiment.

With reference to FIGS. 17 A–B, representations of two micrographs 380 A–B show trench structures 382 and 384. Trench structures 382 were formed with a conventional process (dose equals 30 mJ/cm$^2$, PEB equals 130° C./90s), while trench structures 384 were formed using a hydrophilic overlayer process (dose equals 23.5 mJ/cm$^2$, PEB equals 130° C./60s, bake temperature equals 125° C./60s). The exposure process utilized an ASML 5500/900 scanner, NA equals 0.63, partial coherence equals 0.5 using a resist of PAR707. The hydrophilic overlayer structures 384 as shown are sharper and require a lower dose to print them to a desired critical dimension than is required for conventional structures 382.

It is understood that although the detailed drawings, specific examples, and particular values describe the exemplary embodiments of the present invention, they are for purposes of illustration only. The exemplary embodiments of the present invention are not limited to the precise details and descriptions described herein. For example, although particular materials or chemistries are described, other materials or chemistries can be utilized. Further, although the formation of contacts and trenches are described, the process can be applied to any lithographic process. Various modifications may be made in the details disclosed without departing from the spirit of the invention as defined in the following claims.

What is claimed is:

1. An integrated circuit fabrication process, the process comprising:
   exposing a photoresist layer to a pattern, of electromagnetic energy above a substrate; and
   providing a hydrophilic layer above the photoresist layer, whereby polymers in the hydrophilic layer diffuse into the photoresist layer after provision of the hydrophilic layer, thereby leading to plasticization of photoresist layer polymers in exposed regions relative to unexposed regions.

2. The process of claim 1, wherein the hydrophilic layer includes at least one of polymer or copolymer selected from the groups of fluoroalkyl methacrylic acid, fluoroalkyl acrylic acid, alpha., beta.-monoethylenically unsaturated monomers containing acid functionality, such as monomers containing at least one carboxylic acid group including acrylic acid, methacrylic acid, (meth)acryloxypropionic acid, itaconic acid, maleic acid, maleic anhydride, fumaric acid, crotonic acid, monoalkyl maleates, monoalkyl fumerates and monoalkyl itaconates; acid substituted (meth) acrylates, sulfoethyl methacrylate and phosphoethyl (meth) acrylate; acid substituted (meth)acrylamides, 2-acrylamido-2-methylpropylsulfonic acid and ammonium salts of such acid functional and acid-substituted monomers; basic substituted (meth)acrylates and (meth)acrylamides, amine substituted methacrylates including dimethylaminoethyl methacrylate, tertiary-butylaminoethyl methacrylate and dimethylaminopropyl methacrylamide; acrylonitrile; (meth) acrylamide and substituted (meth)acrylamide, diacetone acrylamide; (meth)acrolein; and methyl acrylate.

3. The process of claim 1, wherein the hydrophilic layer is provided with a surfactant.

4. The process of claim 1, further comprising baking the photoresist layer and the hydrophilic layer.

5. The process of claim 4, further comprising developing the photoresist layer in an aqueous solvent.

6. The process of claim 5, wherein the aqueous solvent is a basic solvent.

7. A method of patterning a photoresist layer for an integrated circuit, the method comprising steps of:

providing a pattern of electromagnetic energy to a photoresist layer;

providing a hydrophilic overlayer above the photoresist layer after the providing a pattern step;

diffusing polymers into the photoresist layer, thereby leading to plasticization of photoresist layer polymers according to the pattern; and developing the photoresist layer to form a photoresist pattern similar to the pattern of electromagnetic energy, whereby resolution and process window is increased due at least in part to the overlayer.

8. The method of claim 7, further comprising baking the overlayer and the photoresist layer to cause hydrophilic polymers in the overlayer to diffuse into the photoresist layer.

9. The method of claim 7, wherein the providing a pattern step utilizes a low dose of radiation.

10. The method of claim 9, wherein the pattern defines trenches or contact holes.

11. The method of claim 7, wherein the developing step removes the overlayer.

12. The method of claim 7, wherein the overlayer includes at least one of polymer or copolymer selected from the groups of fluoroalkyl methacrylic acid, fluoroalkyl acrylic acid, alpha., beta.-monoethylenically unsaturated monomers containing acid functionality, and monomers containing at least one carboxylic acid group including acrylic acid, methacrylic acid, (meth)acryloxypropionic acid, itaconic acid, maleic acid, maleic anhydride, fumaric acid, crotonic acid, monoalkyl maleates, monoalkyl fumerates and monoalkyl itaconates; acid substituted (meth)acrylates, sulfoethyl methacrylate and phosphoethyl (meth)acrylate; acid substituted (meth)acrylamides, such as 2-acrylamido-2-methylpropylsulfonic acid and ammonium salts of such acid functional and acid-substituted monomers; basic substituted (meth)acrylates and (meth)acrylamides, amine substituted methacrylates including dimethylaminoethyl methacrylate, tertiary-butylaminoethyl methacrylate and dimethylaminopropyl methacrylamide; acrylonitrile; (meth)acrylamide and substituted (meth)acrylamide, diacetone acrylamide, (meth) acrolein, and methyl acrylate.

13. A method of patterning an integrated circuit, the method comprising:

providing a lithographic medium including a patterned photoresist material including first regions of exposure to electromagnetic energy and second regions of non-exposure to the electromagnetic energy;

providing an overlayer of hydrophilic material after providing the patterned photoresist material;

diffusing polymeric constituents of the hydrophilic layer into the photoresist material according to the first regions and the second regions; and developing the photoresist material, whereby resolution and process window are increased.

14. The method of claim 13, wherein the photoresist material includes chemically amplified or non-chemically amplified positive tone photoresist material including a hydrophobic polymer.

15. The method of claim 14, wherein the patterned photoresist material defines trenches or contact holes.

16. The method of claim 14, wherein the first regions represent gate conductor or contact lines, trenches or contact holes on an integrated circuit.

17. The method of claim 16, further comprising a surfactant adjacent the hydrophilic layer.

18. The method of claim 13, wherein the hydrophilic layer is a thin layer.

19. The method of claim 13, wherein the photoresist material has a higher glass transition temperature than the photoresist material with the polymeric constituents.

20. The method of claim 13, wherein the first regions define contact holes or trenches.

* * * * *